（12）United States Patent
Smith

(10) Patent No.: US 9,923,076 B2
(45) Date of Patent: Mar. 20, 2018

(54) GATE PATTERNING FOR AC AND DC PERFORMANCE BOOST

(71) Applicant: GLOBALFOUNDRIES Inc., Grand Cayman (KY)

(72) Inventor: Elliot John Smith, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/185,593

(22) Filed: Jun. 17, 2016

(65) Prior Publication Data

US 2017/0365680 A1 Dec. 21, 2017

(51) Int. Cl.
| | |
|---|---|
| *H01L 21/302* | (2006.01) |
| *H01L 29/51* | (2006.01) |
| *H01L 29/417* | (2006.01) |
| *H01L 29/06* | (2006.01) |
| *H01L 29/66* | (2006.01) |
| *H01L 29/786* | (2006.01) |
| *H01L 21/306* | (2006.01) |
| *H01L 21/308* | (2006.01) |

(52) U.S. Cl.
CPC .......... *H01L 29/51* (2013.01); *H01L 21/3085* (2013.01); *H01L 21/30604* (2013.01); *H01L 29/0649* (2013.01); *H01L 29/41783* (2013.01); *H01L 29/6656* (2013.01); *H01L 29/66484* (2013.01); *H01L 29/786* (2013.01)

(58) Field of Classification Search
None
See application file for complete search history.

(56) References Cited

U.S. PATENT DOCUMENTS 5,182,619 A * 1/1993 Pfiester ............. H01L 21/28273
257/344

* cited by examiner

*Primary Examiner* — Jack Chen
(74) *Attorney, Agent, or Firm* — Amerson Law Firm, PLLC

(57) ABSTRACT

A method to reduce parasitic capacitance in a high-k dielectric metal gate (HKMG) transistor with raised source and drain regions (RSD) is provided including forming a multilayer stack for an HKMG gate on a substrate, the multilayer stack including a gate electrode layer of amorphous silicon or polycrystalline silicon, forming a patterned hard mask above the gate electrode layer, etching partially into the gate electrode layer through the patterned hard mask to define multiple partially etched gate stacks and a partially etching gate electrode layer, forming a conformal protective layer wrapping over the partially etched gate electrode layer and the patterned hard mask, and etching through a remainder of the partially etched gate electrode layer with the conformal protective layer wrapped over the partially etched gate stacks and the patterned hard mask, as well as an HKMG transistor resulting therefrom.

20 Claims, 13 Drawing Sheets

GATE PATTERNING FOR AC AND DC PERFORMANCE BOOST

BACKGROUND OF THE INVENTION

1. Field of the Invention

Generally, the subject matter disclosed herein relates to integrated circuits, and, more particularly, to transistor devices, in particular field effect transistor devices, with raised source and drain.

2. Description of the Related Art

As integrated circuits become more and more integrated, the sizes of the corresponding circuit elements, such as transistors, have to shrink accordingly. As a consequence, field effect transistors (FETs) with very thin gate dielectric layers using a high-k dielectric have been developed to mitigate short channel effects. Unfortunately, very thin gate insulators have resulted in increased gate leakages or gate-induced leakages, increasing circuit stand-by power for short transistor gate lengths. As a remedy, sub-threshold leakage and other short channel effects have been controlled and reduced by thinning the device channel layer.

Fully depleted (FD) devices have been formed in ultrathin silicon-on-insulator (SOI) layers, for example, where the silicon channel layer is less than 50 nm or, in some cases, less than 20 nm. Ultrathin FDSOI devices operate at lower effective voltage fields. Additionally, ultrathin SOI layers can be doped for higher mobility, which in turn increases device current and improves circuit performance. Furthermore, ultrathin FDSOI devices have a steeper sub-threshold current swing with current falling off sharply as the gate to source voltage drops below the threshold voltage.

In FDSOI devices, an ultrathin oxide insulator is placed on top of the base silicon. Second, a very thin silicon layer creates the transistor channel. Due to the thinness of this layer, no channel doping is required, making the transistor fully depleted. The buried oxide layer also constrains electrons flowing between the source and drain to significantly reduce performance- and power-degrading leakage current. The fully depleted channel also reduces leakage.

As forming the source/drain region from the same ultra-thin silicon layer increases external resistance and, in particular, contact resistance, raised source/drain (RSD) regions have been produced. The thicker silicon RSD regions have a larger cross-sectional area for lower resistance per unit area (sheet resistance) and are, therefore, effective in overcoming the external resistance problem. Another motivation for the use of RSD regions arises when scaling metal oxide semiconductor field effect transistors (MOSFETs) down in size by bringing metal silicide contacts closer to the gate conductor. If the device channel has a thickness of about 20 nm or less, the thickness of the silicon available to form a silicide contact is limited. RSD regions can mitigate this problem, however, RSD regions that are positioned close to the gate conductor edge will increase the capacitance between the gate and the source/drain regions. Thus, while RSD structures are often utilized, particularly for ultrathin MOSFETs and for FDSOI FETs, to reduce series or parasitic resistance or junction leakage, they generally lead to an increased capacitance, e.g., increased parasitic capacitance.

In the currently developed 22 nm FDSOI technology, this parasitic capacitance leads to a trade-off between AC and DC performance. For good AC performance, a small parasitic capacitance is desirable. On the other side, the critical dimensions of the manufacturing process have a large impact on the DC performance through the gate length and overlap capacitance. Increasing the gate length helps boost the performance such that sidewall spacers cannot be made thicker to reduce the parasitic capacitance.

In view of the above, it is desirable to provide an improved semiconductor device with an RSD structure which allows for further reduction in overall parasitic capacitance and a manufacturing method thereof. In particular, an FDSOI FET is desirable with both excellent AC and DC performance.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to field effect transistor (FET) devices and methods for fabricating the same, wherein a parasitic capacitance between the gate electrode and raised source and drain (RSD) regions is reduced by gate patterning.

A reduced parasitic capacitance is achieved by increasing the distance of the upper portion of the gate to the RSD while maintaining a good overlap. The Miller capacitance can be independently tuned by selectively etching back the titanium nitride (TiN) layer which lies below the amorphous silicon (Si), while maintaining the critical dimension of the lower part of the amorphous silicon (Si) gate.

To increase the distance of the upper portion of the gate to the RSD, the gate profile is formed in two steps with the deposition of a conformal protective layer, such as a molecular layer deposition (MLD) layer, in between. In a first phase, the gate electrode layer is partially etched, e.g., half-way, to form an upper portion of the gate profile with a smaller lateral extent. After the first phase, the protective layer is deposited over the gate profile to wrap over it such that the lateral extent of the upper profile plus the thickness of the protective layer on the sides of the upper profile defines the lateral extent of the lower portion of the gate profile. During the subsequent etch of the gate electrode layer, the wider lower portion is protected by the protective layer such that a cascaded gate profile is created. Due to the cascaded gate profile, a distance of the upper portion of the gate to the RSD is larger than the distance of the lower portion of the gate to the RSD. As a result, parasitic capacitance can be reduced without affecting the overlap of the lower gate portion with the source and drain regions in the substrate. As a result, a transistor, e.g., a MOSFET or an FDSOI FET, with excellent AC and DC performance can be provided.

Furthermore, provision of the protective layer after performing the cutting of the gate lines allows for a reduction of the bottom critical dimension of the cutting process due to the protective layer acting as an extra mask for the final etch step. As a consequence, the tip-to-tip distance of the formed gate structures can be reduced, thereby leading to a higher integration of the semiconductor device.

Finally, etching the lower portion of the gate profile is a self-aligned process with the protective layer acting as a mask. Thus, only one additional deposition step, i.e., the deposition of the MLD layer, has to be added to the standard manufacturing process to provide the above-described gate profile with reduced parasitic capacitance.

BRIEF DESCRIPTION OF THE DRAWINGS

The disclosure may be understood by reference to the following description taken in conjunction with the accompanying drawings, in which like reference numerals identify like elements, and in which.

Figure 1:
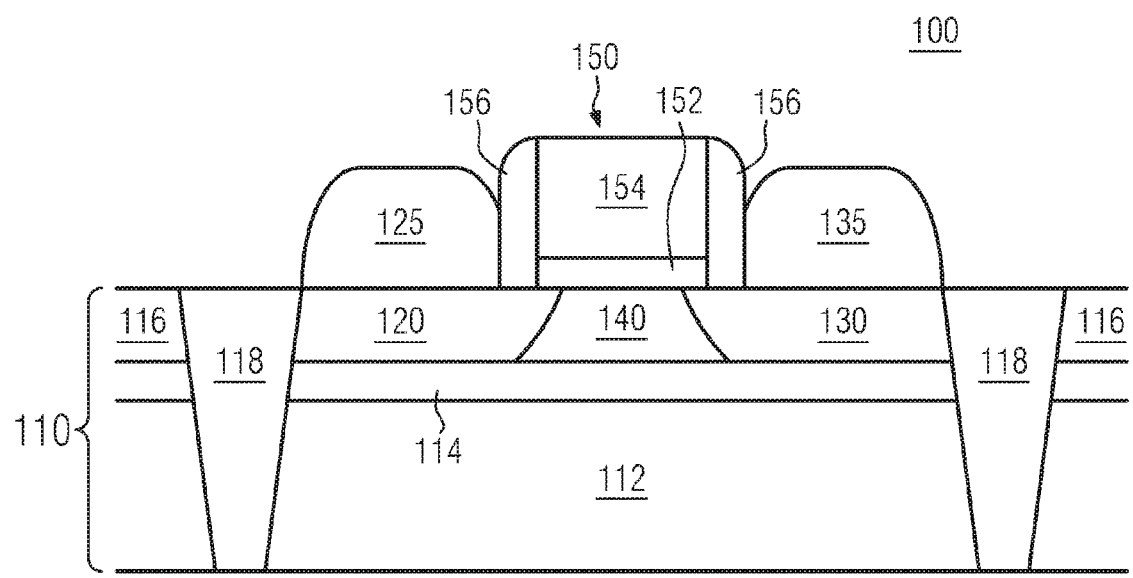
FIG. 1 illustrates an HKMG field effect transistor (FET) with raised source and drain (RSD) regions of the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numerous specific details are given to provide a thorough understanding of the disclosure. However, it would be apparent that the embodiments of the disclosure may be practiced without the specific details. In order to avoid obscuring the present disclosure, some well-known structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, directional terms such as "over," "on," "underneath," "above," "below," "upper," "lower," "vertical" and "horizontal" are intended to provide relative positions for purposes of the description, and are not intended to designate an absolute frame of reference. For example, FETs may be oriented spatially in any manner different from the orientations shown in the drawings. "Vertical" is used to refer to a direction normal to the surface of the substrate, "horizontal" is used to refer to a direction parallel to the surface of the substrate, and "planar" is used to refer to the plane parallel to the surface of the substrate. "Upper" is used to refer to a vertical direction away from the surface of the substrate. An element positioned "above" ("below") another element is located farther away from (closer to) the surface of the substrate as compared to the other element. The term "on" is used to indicate that there is direct contact between elements.

As will be readily appreciated by those skilled in the art upon a complete reading of the present application, the present disclosure is applicable to a variety of technologies, for example, NMOS, PMOS, CMOS, etc., and is readily applicable to a variety of devices, including, but not limited to, logic devices, memory devices, SRAM devices, etc., in principle. The techniques and technologies described herein can be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that employs gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

FIG. 1 illustrates an HKMG field effect transistor (FET) with raised source and drain (RSD) regions as known in the prior art. It is understood that the thickness of the layers depicted in the figures of the present disclosure are not representative of their relative thicknesses, but may be modified for illustrative purposes.

The exemplary prior art transistor 100 includes a raised source region 125, a raised drain region 135 and an HKMG gate 150. The transistor 100 is formed on a substrate 110, which, in the illustrated example, is a silicon-on-insulator (SOI) substrate with a semiconductor bulk substrate 112, a buried oxide (BOX) layer 114 formed on the semiconductor bulk substrate 112 and a semiconductor layer 116 formed on the BOX layer 114. Shallow trench isolation (STI) regions 118 may be formed in the SOI substrate to electrically isolate the transistor device 100 from other electric components of an IC formed on the SOI substrate.

In the semiconductor layer 116, a source region 120, a channel region 140 and a drain region 130 may be formed as known in the art. For shallow junctions and reduced short-channel effects, a raised source region 125 may be formed on the source region 120 and a raised drain region 135 may be formed on the drain region 130, e.g., by selective epitaxial growth. The HKMG control gate 150 may comprise a high-k dielectric constant dielectric layer 152 and a gate electrode 154 which are insulated against the RSD regions 125 and 135 by sidewall spacers 156. The gate electrode 154 may be a metal gate electrode and/or a silicon gate electrode, doped with the appropriate dopants for conductivity. The silicon gate electrode may be comprised of amorphous silicon or polycrystalline silicon. In the case of a silicon gate electrode, one or several work-function metal layers may be provided between the gate dielectric layer 152 and the gate electrode layer 154. Also, more than one dielectric layer may be provided for the gate dielectric layer. For simplicity, element 152 shows the above-mentioned gate dielectric layer(s) and work-function metal layer(s) as a single layer which may be referred to as the HKMG layer. The HKMG gate stack thus comprises a silicon gate electrode layer on such an HKMG layer. Due to their raised profile, a significant parasitic capacitance arises between the RSD structures 125 and 135 and the gate electrode 154, which severely affects AC performance of the transistor.

FIGS. 2A-2I illustrate an exemplary manufacturing process of an HKMG transistor with RSD regions and reduced parasitic capacitance according to the present disclosure by way of two-dimensional cross-sections.

Figure 2A:
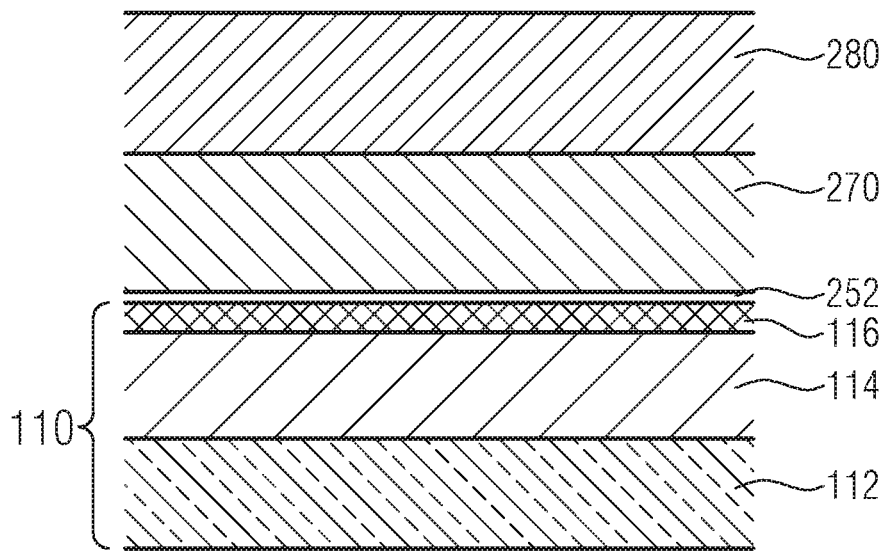
FIGS. 2A-2I illustrate an exemplary manufacturing process of an HKMG transistor with RSD regions according to the present disclosure by way of two-dimensional cross-sections.

In FIG. 2A, a multilayer stack for an HKMG gate is provided on a substrate 110 using processing means well known in the art. The term "substrate" as used herein is intended to include a semiconductor substrate, a semiconductor epitaxial layer deposited or otherwise formed on a semiconductor substrate and/or any other type of semiconductor body. For example, the semiconductor substrate may comprise a semiconductor wafer (e.g., silicon, SiGe, or an SOI wafer) or one or more die on a wafer, and any epitaxial layers or other type of semiconductor layers formed thereover.

According to the illustrative example shown in FIG. 2A, a multilayer stack is provided on an SOI substrate 110, in particular an FDSOI substrate. The SOI substrate 110 comprises a semiconductor bulk substrate 112, a buried oxide (BOX) layer 114 formed on the semiconductor bulk substrate 112 and a semiconductor layer 116 formed on the BOX layer 114. The semiconductor layer 116 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like.

The BOX layer 114 may comprise silicon (di)oxide or a borosilicate glass (BPSG). The BOX layer may be composed of different layers and one of the different layers may comprise BPSG or an $SiO_2$ compound comprising boron or phosphorus. The semiconductor bulk substrate 112 may comprise or consist of silicon, in particular, single crystal silicon. Other materials may be used to form the semiconductor bulk substrate 112 such as, for example, germanium, silicon germanium, gallium phosphate, gallium arsenide, etc. By way of example, the thickness of the semiconductor layer 116 may be in the range of 5-30 nm, in particular 5-15 nm, and the thickness of the BOX layer 114 may be in the range of 10-50 nm, in particular 10-30 nm, more particularly 15-25 nm.

Shallow trench isolation (STI) regions (not shown in FIGS. 2A-2I) may be formed in the SOI substrate 110 to electrically isolate the transistor device from other electric components of an IC formed on the SOI substrate. The STI regions may be formed by etching openings through the semiconductor layer 116 and the BOX layer 114 and into the semiconductor bulk substrate 112 and filling the openings with an insulating material, such as an oxide material.

The multilayer stack for the HKMG gate includes the above-mentioned HKMG layer 252 on the semiconductor layer 116, a gate electrode layer 270 on the HKMG layer 252, and a hard mask layer 280 on the gate electrode layer 270.

The HKMG layer 252 may comprise a bottom layer comprising or consisting of a high-k dielectric material, i.e., a material with a dielectric constant (k) greater than about 3.9, such as hafnium-oxide ($HfO_2$), hafnium-silicon-oxide ($HfSiO_3$), or hafnium-lanthanum-oxide ($HfLaO_x$). Other metal oxide-based materials may be used as well, such as a uniform or composite layer comprised of one or more of $Ta_2O_5$, $TiO_2$, $Al_2O_3$, $Y_2O_3$ and $La_2O_5$. According to some exemplary embodiments, the (high-k) dielectric layer may be formed directly on the semiconductor layer 116. According to other embodiments, the (high-k) dielectric layer may be formed on an insulating layer comprising silicon oxide or silicon oxynitride which is formed on the semiconductor layer 116. The high-k dielectric layer may have a thickness in a range of about 1-3 nm.

The HKMG layer 252 may further comprise a work function metal layer, such as TiN, as a middle layer or as part of a middle layer on the gate dielectric layer. Any other appropriate work function adjusting metal or metal oxide that is known in the art may be used for the work function metal layer. The work function metal layer may be considered as the metal-containing layer of a metal gate and may have a thickness as low as about 10 nm. A further metal-containing layer comprising at least one of tantalum nitride (TaN), tantalum (Ta), tungsten (W) or the like with a thickness below 50 nm, in particular below 20 nm, may be provided on the work function metal layer as part of the gate electrode. Despite the name HKMG, such an additional metal-containing layer is not required for the gate electrode due to the presence of the work function metal layer. For the sake of clarity, this metal-containing layer and the individual layers of the HKMG layer 252 are not shown explicitly in the figures. Nevertheless, it shall be understood that the above-described embodiments of the HKMG layer may be used in the present and all other figures of the present disclosure.

The multilayer stack further comprises a gate electrode layer 270 on the HKMG layer 252. The gate electrode layer 270 may be an amorphous or polycrystalline silicon layer with a thickness in a range of about 15-100 nm, more specifically in the range of about 20-30 nm. The silicon gate electrode layer 270 may be doped with impurities of the appropriate polarity and density to provide the desired conductivity. The possible dopants include, but are not limited to, arsenic (As), boron (B) and phosphorus (P).

Finally, a hard mask layer 280 is deposited on the gate electrode layer 270 as part of the initial multilayer stack. The hard mask layer 280 may be a single SiN layer or a layer of $SiO_2$ on top of a SiN layer. Other appropriate materials for the hard mask layer 280 may be metal, spin-on organic material, silicon carbide, tetraethyl orthosilicate (TEOS), silicon nitride carbide (SiCN), silicon oxynitride (SiON), amorphous silicon, spin-on glass (SOG), or a combination thereof. The hardmask layer 280 may have a thickness of 25-80 nm.

Unless explicitly specified otherwise, "depositing" here and in the following may include any known technique appropriate for the material to be deposited, including, but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), molecular layer deposition (MLD), chemical oxidation, molecular beam epitaxy (MBE), plating and evaporation.

The present disclosure relates to the manufacturing of HKMG transistors using the so-called "gate first" technique, wherein one or more etching processes are performed to pattern the gate stack from an initial multilayer stack as described above to thereby define the basic gate structures for the transistor devices.

Figure 2B:
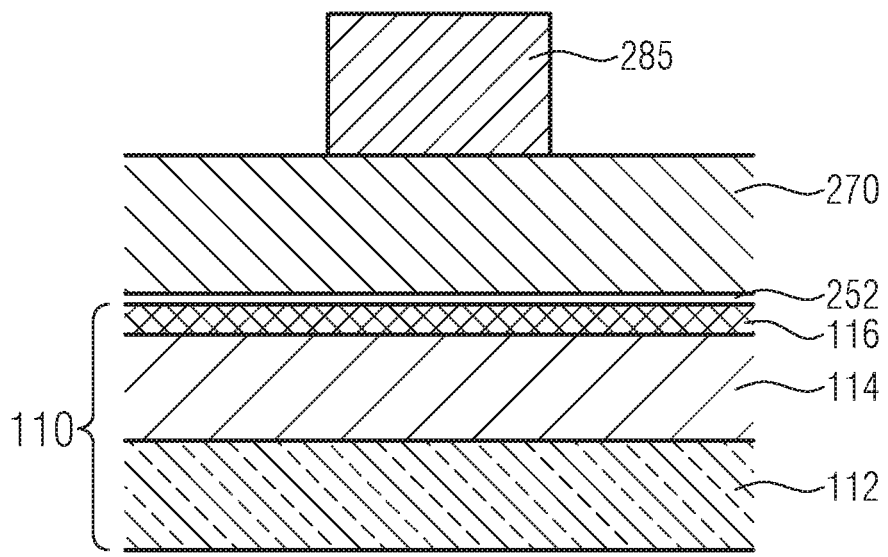

In a first step of the manufacturing method of the present disclosure, a patterned hard mask 285 is formed by patterning the hard mask layer 280, as shown in FIG. 2B. To form the patterned hard mask 285, the hard mask layer 280 is etched using one or several hard mask patterns to create openings for the structuring of the gate stack. The hard mask layer 280 may be lithographically patterned and etched using conventional processing. By way of example, dry etching may be performed to transfer a photoresist pattern to the hard mask layer. In a first patterning step, a so-called poly-line hard mask open (PC-HMO) step, trench openings may be formed in the hard mask layer 280 along a first planar dimension to etch the pattern of the gate lines into the hard mask layer. Here and in the following, the term "poly-line (PC)" is used synonymously for lines formed from the silicon gate electrode layer, whether made of amorphous or polycrystalline silicon, and for lines formed from the hard mask layer. Also, the term gate line is used synonymously with the term poly-line, thus referring to parallel lines structured from the silicon gate electrode layer along a first planar dimension. The photoresist mask may be stripped and replaced with a further photoresist mask to perform a consecutive cut patterning step across the poly-lines, a so-called cut hard mask opening (CT-HMO) step. In this CT-HMO step, the hard mask 280 is further patterned along the second planar dimension, i.e., orthogonal to the first planar dimension, to define a plurality of gate structures by cutting the lines of the hard mask 285. As a result, a two-dimensionally patterned hard mask 285 is formed which is used to form the gate stack from the underlying layers of the multilayer stack. As will be described in detail below with respect to FIGS. 3A-5G, the CT-HMO step may be performed before or after providing the conformal protective layer.

Figure 2C:
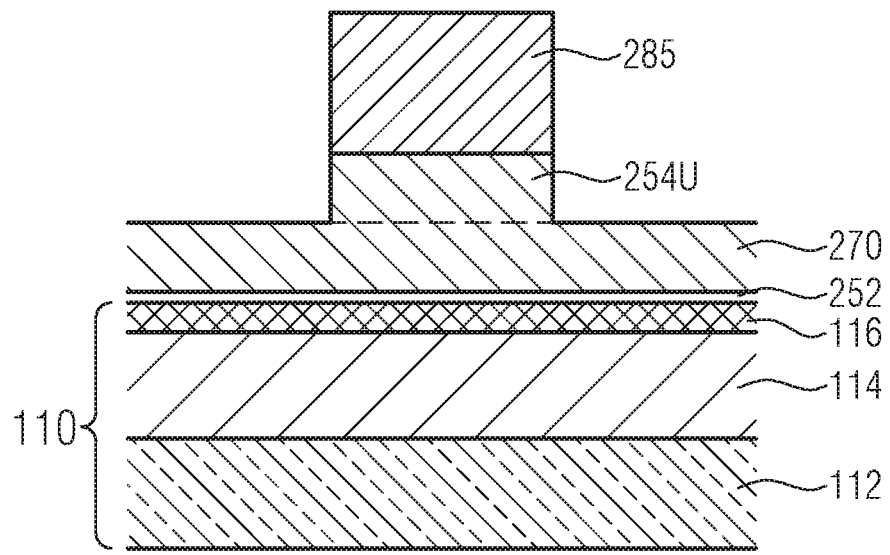

Using the patterned hard mask 285, the gate electrode layer 270 is then partially etched to create recesses in the silicon of the gate electrode layer using conventional etching techniques and the patterned hard mask 285. This partial etch step is, however, controlled, e.g., via controlled duration of the etch process, to etch into the silicon layer only to a predetermined depth, which may lie in the range of 20-80% of the initial thickness of the gate electrode layer 270. In FIG. 2C, this predetermined depth is indicated by a dashed line. As a result of the partial etching, an upper portion 254U of the final gate is defined with a lateral extent, i.e., width, corresponding to the lateral extent of the patterned hard mask 285. Depending on the previous patterning of the hard mask 285, this upper portion 254U may be in the form of gate lines or gate structures. In any case, partially etching the multilayer stack as described above defines a plurality of partially etched gate stacks over the SOI substrate 110. As can be seen in FIG. 2C, a part of the silicon gate electrode layer 270 remains unaffected by this partial etching, which will be processed later on.

Figure 2D:
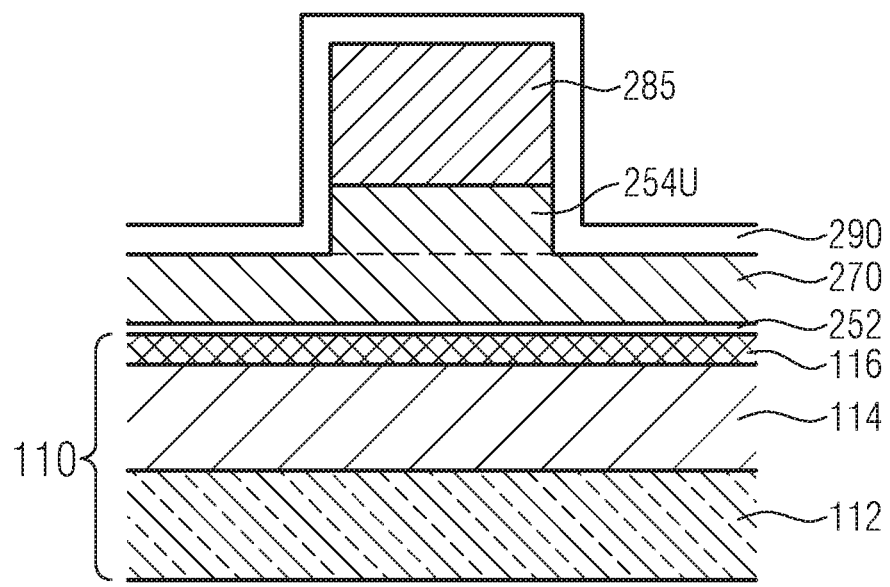

Subsequent to the partial etching, a conformal protective layer 290 is provided which wraps over the partially etched gate electrode layer 254U and 270 and the patterned hard mask 285, as shown in FIG. 2D. The protective layer 290 may be conformally deposited, e.g., by molecular layer deposition (MLD), over the partially etched gate stacks. As a consequence, the protective layer 290 covers and is in direct contact with the remains of the gate electrode layer 270, the upper portion of the gate 254U and the patterned hard mask 285, both with their upper surfaces and their side surfaces. The conformal protective layer 290 may be a nitride layer or a low-k dielectric layer. The low-k material could be one of, but not limited to, SiBCN or SiOCN. Thus, an MLD SiN or a low-k liner may be blanket-deposited as the conformal protective layer 290. The protective layer 290 may be formed with a thickness of 2-10 nm.

Figure 2E:
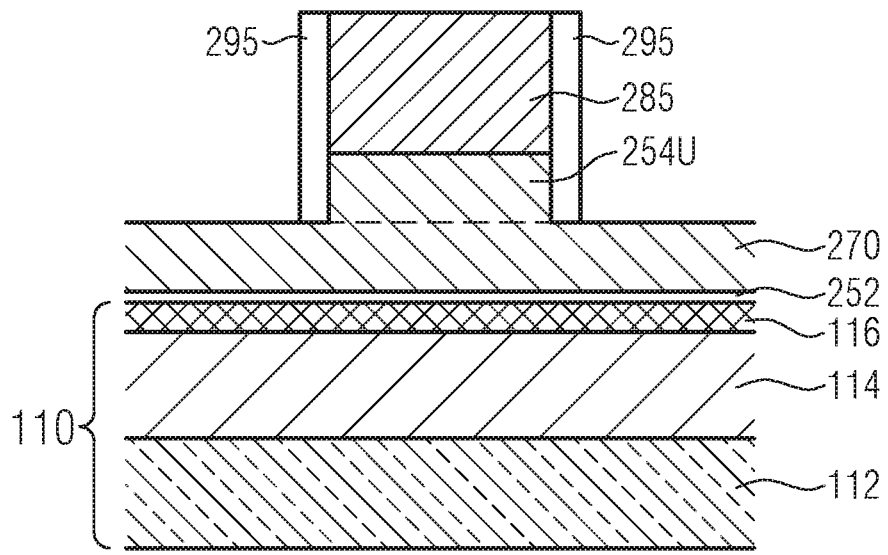

After provision of the conformal protective layer 290, horizontal parts of the protective layer, i.e., parts of the protective layer parallel to the surface of the SOI substrate 110, are removed, for instance, by anisotropically etching the protective layer. The anisotropic etching breaks through the areas of the protective layer parallel to the substrate 110 but leaves the parts of the protective layer on the lateral surfaces of the upper portion 254U and the patterned hard mask 285 (mostly) untouched, as shown in FIG. 2E. As a consequence, the sides of the upper portion of the gate stack are encased with the remnants 295 of the protective layer which add to the total lateral extent of the top portion of the gate stack. This lateral remnant increases the lateral extent of the upper portion 254U by twice the thickness of the lateral cover.

Figure 2F:
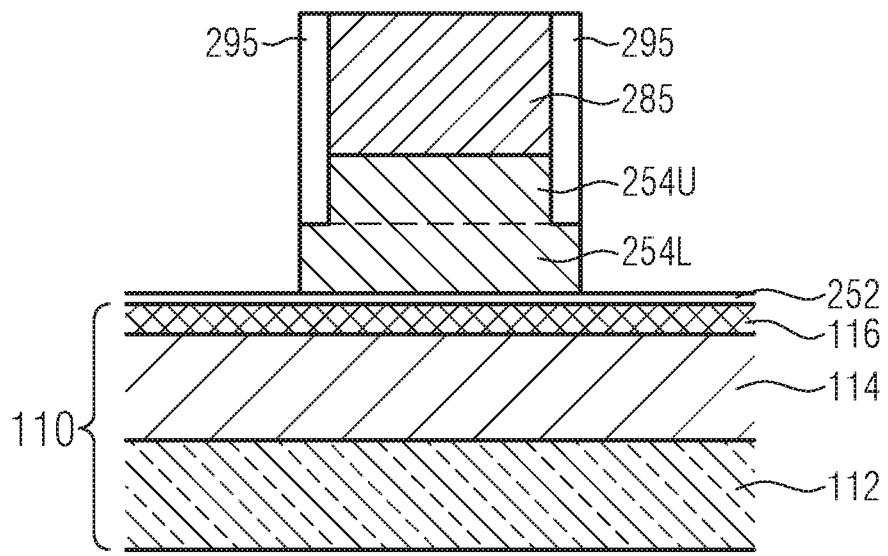

As a result of the masking effect of the lateral remnant of the conformal protective layer wrapped over the partially etched gate stacks, the subsequent etching step through the remainder of the gate electrode layer 270 forms a lower portion 254L of the gate electrode with a larger lateral extent, i.e., width, than the upper portion 254U, as shown in FIG. 2F. Consequently, a cascaded or stepped profile of the gate electrode is formed. Depending on whether the above mentioned CT-HMO step is performed before or after deposition of the conformal protective layer, the lower portion 254L has a larger extent in the first dimension, i.e., in the direction perpendicular to the gate lines, or in both planar dimensions, i.e., also between gate structures along the gate lines. With respect to the direction perpendicular to the gate lines, the cascaded gate profile increases the distance of the upper portion 254U from the neighboring RSD regions and thus reduces the parasitic capacitance. The HKMG layer 252 may be used as an etch stop layer for etching through the remainder of the gate electrode layer 270.

Figure 2G:
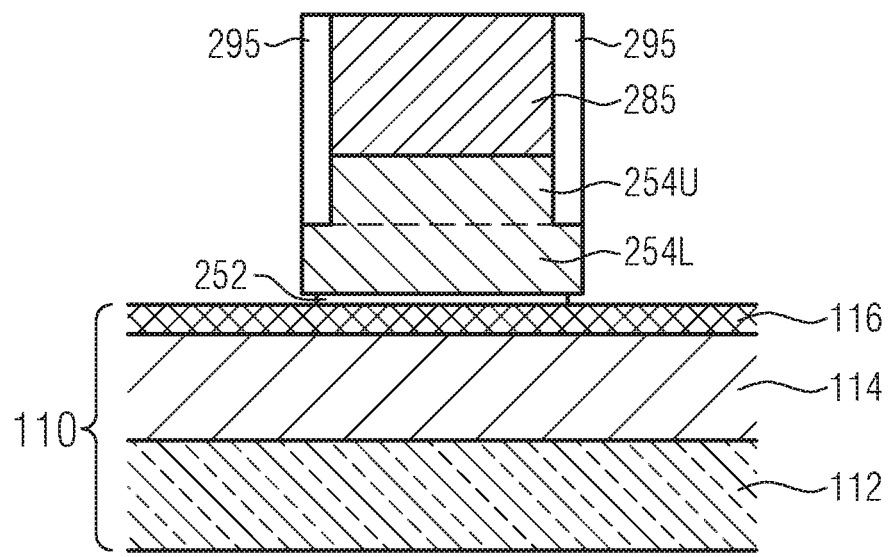

After completion of the stepped profile of the silicon gate electrode, one or several etch steps are performed to etch through the middle layer and the bottom layer, i.e., the HKMG layer 252, in regions outside the fully etched gate electrode layer to form fully etched gate structures, as shown in FIG. 2G. Here, the semiconductor layer 116 may act as an etch stop layer. Although shown with a slight etching under the lower portion 254L in FIG. 2G, such over-etching of the HKMG layer 252 is not essential for the present disclosure. The etching of the HKMG layer 252 may be performed using any of the methods known in the art.

Figure 2H:
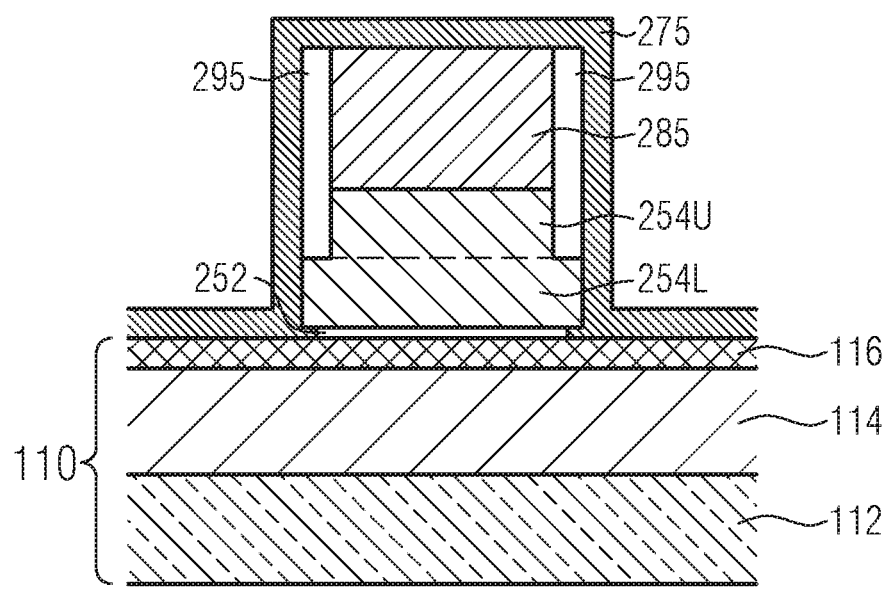
Figure 2I:
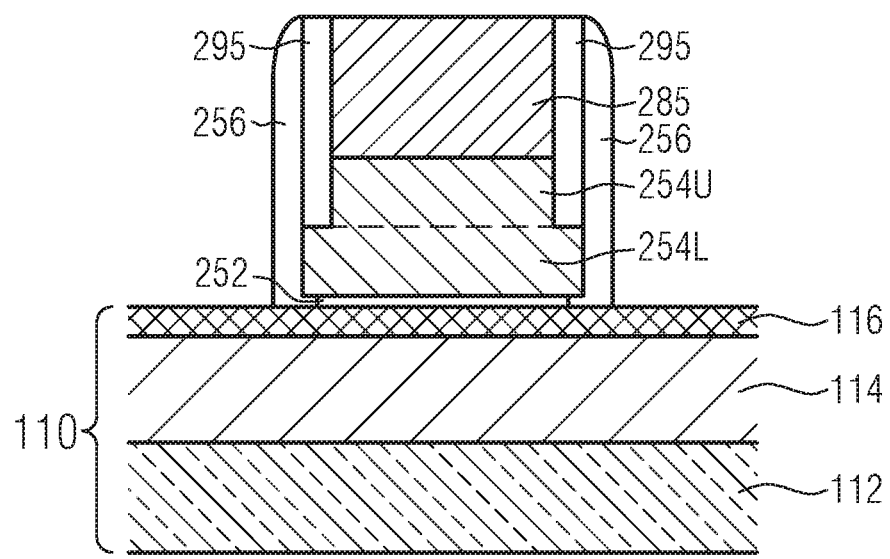

After completion of the gate structuring, a spacer layer 275, such as an SiN or low-k material layer, may be formed over the fully etched gate structures, e.g., in the form of a multilayer by subsequently growing or depositing the respective layers, as shown in FIG. 2H. The spacer layer 275 may then be anisotropically etched to form sidewall spacers 256 on the sides of the gate structure, as shown FIG. 2I. It can further be seen from FIG. 2I that the sidewall spacers 256 are in direct contact with the sides of the lower portion 254L of the gate electrode, while the remnant 295 of the protective layer 290 is provided between the spacers 256 and the upper portion 254U as well as the patterned hard mask 285.

Figure 6:
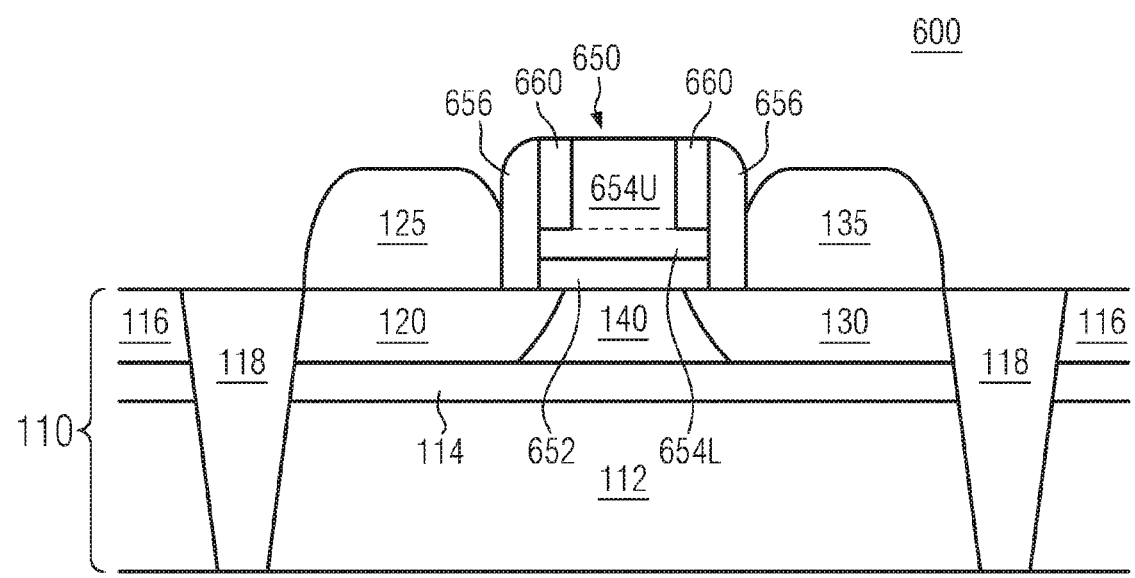
FIG. 6 shows the final structure of an HKMG transistor with RSD regions according to the present disclosure.

Furthermore, raised source and drain regions may be formed from the semiconductor layer 116, for example by selective epitaxial growth. Thereby, raised source and drain regions are formed adjacent to the sidewall spacers 256, as can be seen from the final structure shown in FIG. 6. Due to the selective epitaxial growth, the RSD regions can be tapered towards their top such that the distance to the upper portion 654U of the gate electrode is further increased. The RSD regions may have thicknesses in the range of 15-50 nm, for example. Finally, the patterned hard mask 285 may be removed to expose a top surface of the upper portion 254U of the gate electrode layer, as shown in FIG. 6. The upper surface of the gate electrode 254U as well as the raised source and drain may further be silicided to provide an appropriate electrical contact to backend structures. Silicidation may comprise deposition of a NiPt, Ni or Co layer on the surfaces of the RSD regions and the upper surface of the upper portion 254U of the gate electrode and performing one or more thermal anneal processes. The resulting silicided regions provide low-resistance contacts for the backend structures.

In the following, three different illustrative examples are given for the above-described method of manufacturing a cascaded or stepped gate electrode profile. In the figures, identical reference signs indicate identical or similar components as described with respect to FIGS. 1 and 2A-2I such that a repeated description is omitted for the sake of clarity. It shall be understood, however, that the above-described embodiments and variations may equally be applied to the below-described examples.

FIGS. 3A-3G show a series of three-dimensional structures illustrating a manufacturing method of a plurality of HKMG transistors according to a first illustrative example of the present disclosure. According to this first example, deposition of the conformal protective layer occurs after partially etching into the gate electrode layer to define the gate lines but before performing the CT-HMO step as described above.

Figure 3A:
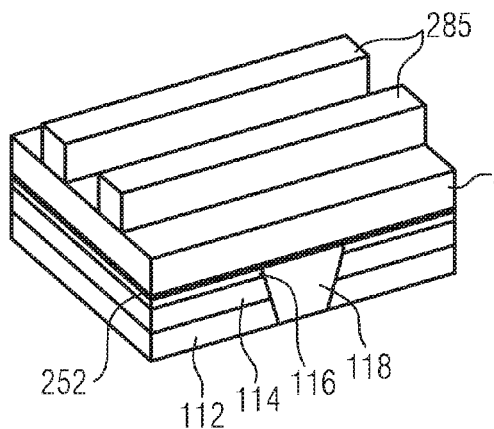
FIGS. 3A-3G show a series of three-dimensional structures illustrating a manufacturing method of a plurality of HKMG transistors according to a first illustrative example of the present disclosure.

The first FIG. 3A of the series shows the multilayer stack on the SOI substrate with the semiconductor bulk substrate 112, the BOX layer 114, the semiconductor layer 116, and the shallow trench isolation regions 118, wherein a gate electrode layer 270 is provided on the HKMG layer 252, which is itself provided on the semiconductor layer 116. The three-dimensional structure further comprises the patterned hard mask 285 in the form of gate lines extending along a first planar dimension.

Figure 3B:
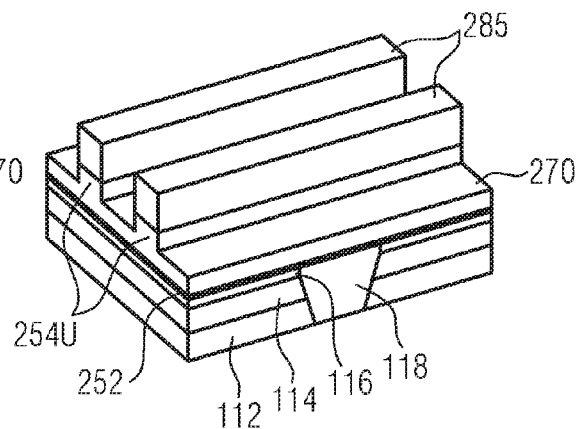
Figure 3C:
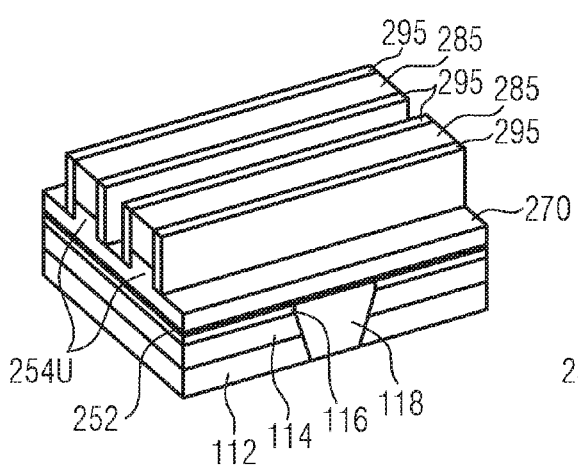

FIG. 3B shows the three-dimensional structure after the partial etching into the gate electrode layer 270 to form the upper portions 254U of multiple gate lines extending along the first planar direction. As can be seen from the figure, this partial etching is performed in a self-aligned way with the patterned hard mask 285. FIG. 3C shows the structure after deposition and anisotropic etching of the conformal protective layer wherein the lateral remnants 295 of the protective layer can be seen to cover the sides of both the patterned hard mask 285 and the upper portion 254U of the gate electrodes. These remnants thus encapsulate the top of the gate structure, e.g., with an SiN liner, such that a critical dimension for the subsequent manufacturing steps is equal to the bottom critical dimension for SiN patterning. The final gate length of the device will be defined as the original critical dimension formed in the hard mask 285 plus twice the thickness of the deposited encapsulation layer 290.

Figure 3D:
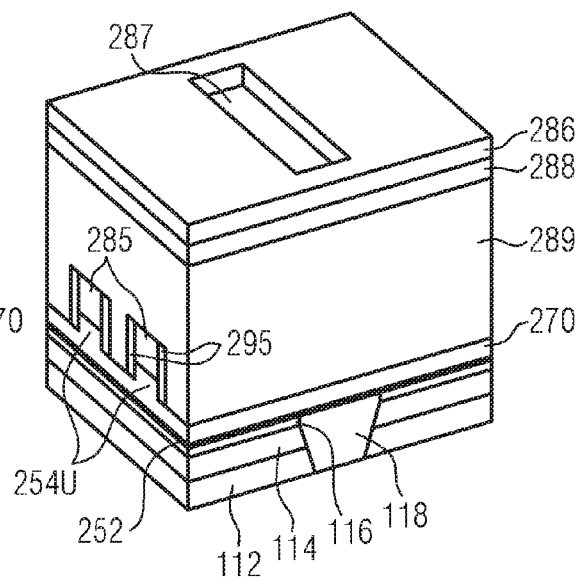
Figure 3E:
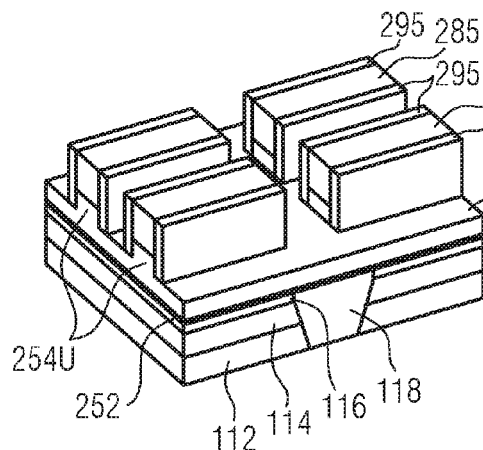

FIG. 3D shows a patterned mask for the cut step (CT-HMO). A mask comprising a planarization layer 289, a hard mask layer 288 and a photoresist mask 286 is deposited on the structure of FIG. 3C and then cut by lithographical patterning of the photoresist mask 286 to form openings 287. These openings are then used to perform the cut etching step across the gate lines, as shown in FIG. 3E, wherein the mask has already been stripped. By the CT-HMO step, the gate lines of the hard mask 285 are cut in a direction perpendicular to the gate lines. The CT-HMO may cut through the hard mask 285 only, or be extended into the gate electrode layer 270 to match the recess formed in the partial etching step of FIG. 3B, as shown in an illustrative way in FIG. 3E. As the MLD liner 295 according to this example is only provided between the poly-lines, the tip-to-tip distance between two adjacent gate structures along a poly-line remains unchanged.

Figure 3F:
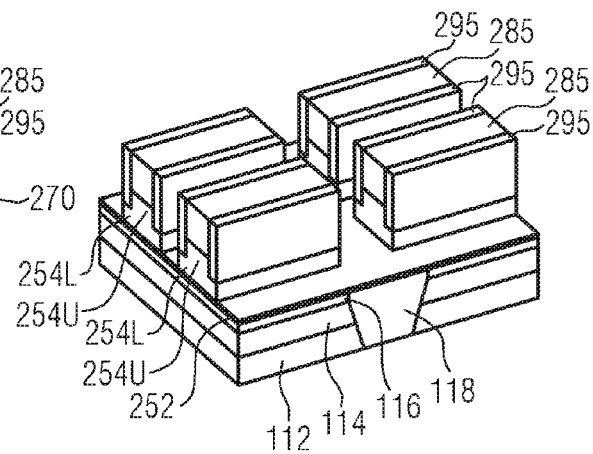
Figure 3G:
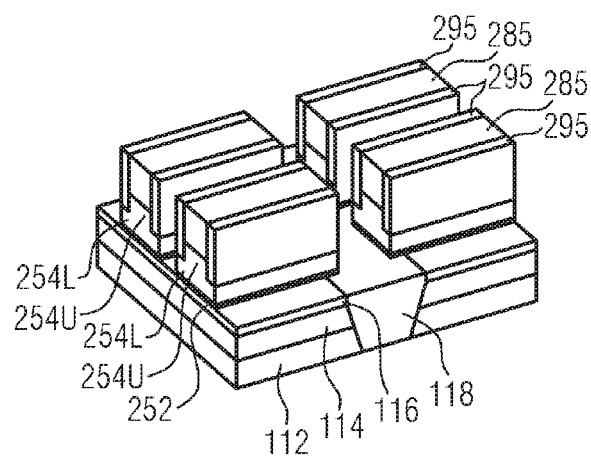

FIG. 3F shows the structure after completion of the etching step of the gate electrode layer. Due to the mask effect of the patterned mask 285 in combination with the lateral remnants 295 of the MLD liner, a lower portion 254L of the gate electrodes is formed with a larger lateral extent than the respective upper portion 254U, as described above. The figure also shows that the HKMG layer 252 is now exposed in areas not covered by the gate structures. In FIG. 3G, these areas of the HKMG layer 252 have been removed using standard processing techniques for HKMG FET transistors. As a consequence, an upper surface of the semiconductor layer 116 is exposed in regions where the sidewall spacers and the source and drain regions will be formed (not shown). Removal of the HKMG layer 252 in exposed areas also exposes the STI 118, thereby electrically separating the depicted two rows of gate structures. Further processing steps may follow according to standard FET manufacturing techniques to complete the transistor and IC structure as well as to provide appropriate backend structures.

The manufacturing method according to the first illustrative example does not affect the tip-to-tip distance of the resulting gate structures. It may, however, be implemented by simply extending known manufacturing methods by the self-aligned deposition of the MLD liner, which does not add significantly to the overall complexity and cost of the manufacturing process. As a result of the cascaded profile of the gate electrode, a substantial reduction of the parasitic capacitance can be achieved with corresponding improvement of the AC performance of the resulting transistors.

FIGS. 4A-4G show a series of three-dimensional structures illustrating an alternative manufacturing method of a plurality of HKMG transistors according to a second illustrative example of the present disclosure. The depicted manufacturing method agrees with the manufacturing method according to the first illustrative example with the exception that the deposition of the conformal protective layer occurs after cutting the poly-lines using the CT-HMO step.

Figure 4A:
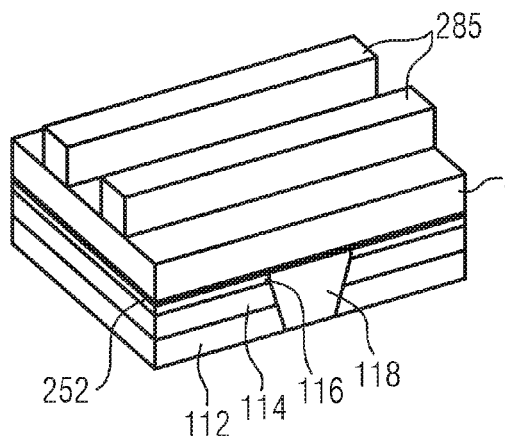
FIGS. 4A-4G show a series of three-dimensional structures illustrating a manufacturing method of a plurality of HKMG transistors according to a second illustrative example of the present disclosure.
Figure 4B:
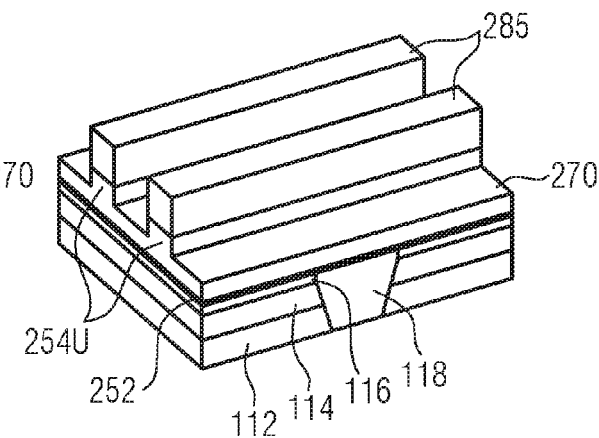
Figure 4C:
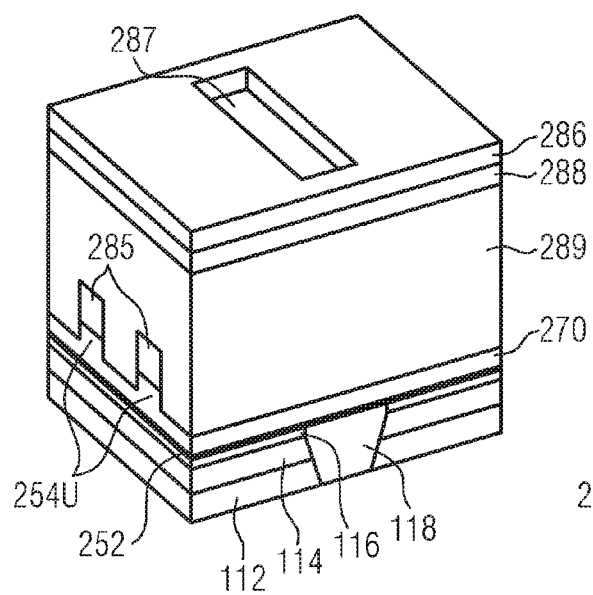

Consequently, the series starts off with a structure identical to the one of FIG. 3A in FIG. 4A. At this stage, the hard mask 285 has been patterned to form gate lines extending along the first planar dimension. Equally to FIG. 3B, these patterned lines of the hard mask 285 are used to partially etch into the gate electrode layer 270 to define the upper portion 254U of the gate electrode along the first dimension in FIG. 4B. Different from the above-described example, however, the conformal protective layer is not deposited at this stage as in FIG. 3C. Instead, the above-described cut mask including the planarization layer 289, the hard mask layer 288 and the photoresist mask 286 is deposited on the patterned hard mask 285 and the partially etched gate electrode layer 270, as shown in FIG. 4C. Openings 287 are formed in the mask using photolithography and the gate lines are cut by performing the CT-HMO step.

Figure 4D:
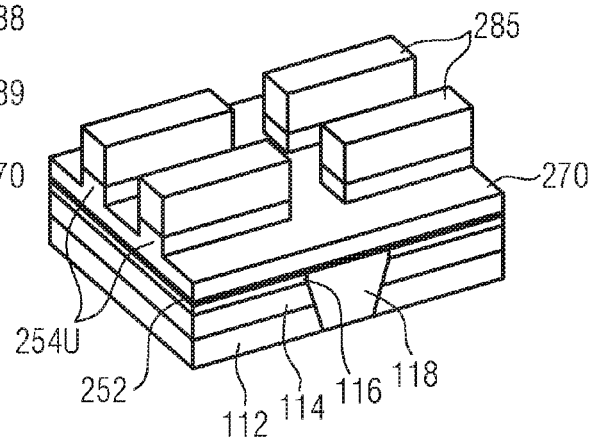
Figure 4E:
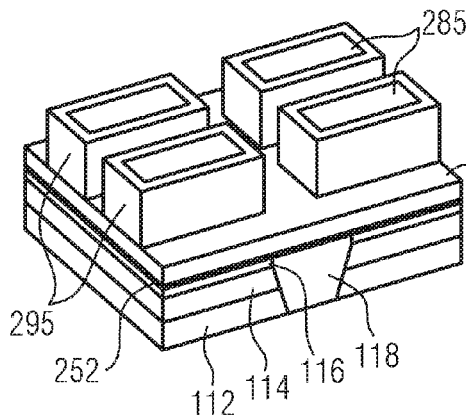

As the conformal protective layer has not yet been provided, the subsequent silicon etching step using the cut mask is, however, carried out to only partially etch the gate electrode layer to a substantially similar thickness as in the preceding PC-HMO step, as can be seen from FIG. 4D after removal of the cut mask. The PC-HMO and CT-HMO etching of the gate electrode layer according to this example may be carried out so as to etch the gate electrode layer down to 20-80% of its initial thickness everywhere around the two-dimensionally patterned hard mask 285. A subsequent deposition of the conformal protective layer and breakthrough of the horizontal parts of this layer by anisotropic etching will then provide a lateral encasement of the patterned hard mask 285 and upper portions 254U of the gate structures with the remnants 295 of the protective layer, as shown in FIG. 4E.

Figure 4F:
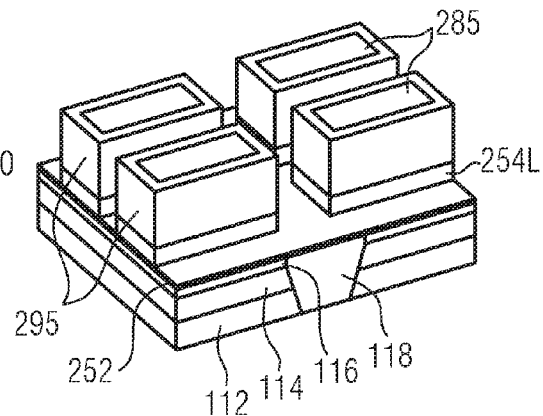
Figure 4G:
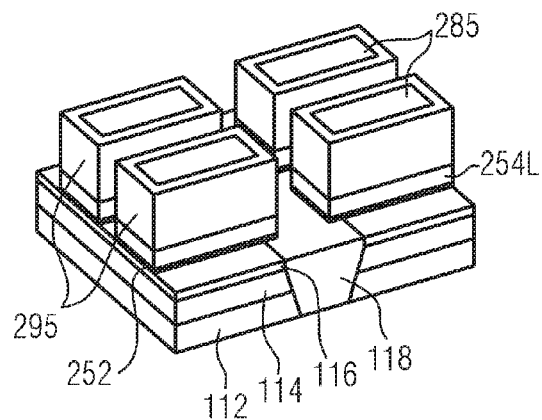

Together with the patterned hard mask 285, this encasement 295 provides a mask for the self-aligned etching of the lower portion 254L of the gate electrode, as shown in FIG. 4F. In addition to the padding of the lateral sides of the upper portion 254U, the remnants 295 of the protective layer according to this illustrative example also provide a padding of the upper portion 254U in the second planar dimension, i.e., along the gate lines. This allows further reducing the PC-PC tip-to-tip distance because the padding of the sides of the upper portion 254U of the gate electrodes along the gate lines allows for a reduction of the bottom critical dimension. Again, the described method only adds one self-aligned deposition step of the MLD liner to the manufacturing technique. The final result is shown in FIG. 4G with the semiconductor layer 116 and the STI regions 118 being exposed. The main difference with respect to the structure of the first illustrative example becomes apparent when cutting the final gate structures along the original poly-lines, thereby exposing the padding with the conformal protective layer in the second planar dimension.

FIGS. 5A-5G show a series of three-dimensional structures illustrating another alternative manufacturing method of a plurality of HKMG transistors according to a third illustrative example of the present disclosure. This alternative manufacturing method is similar to the second illustrative example with the exception that the patterning of the hard mask is completed before partially etching the gate electrode layer.

Figure 5A:
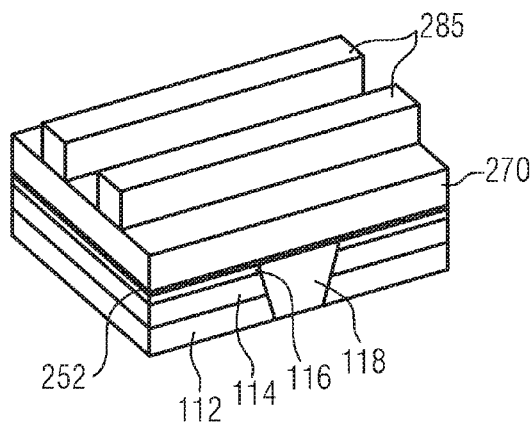
FIGS. 5A-5G show a series of three-dimensional structures illustrating a manufacturing method of a plurality of HKMG transistors according to a third illustrative example of the present disclosure.
Figure 5B:
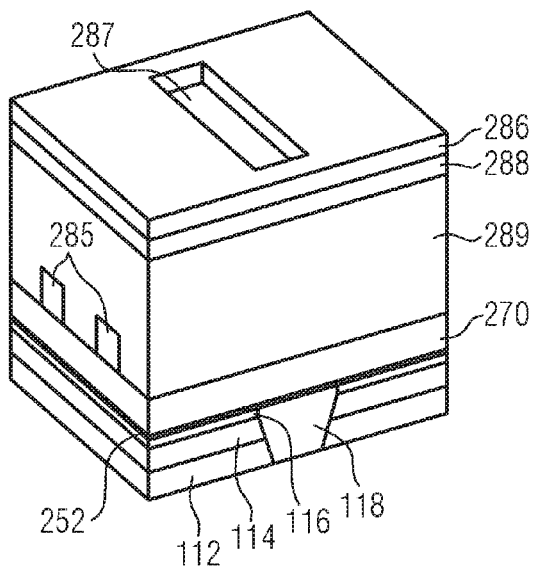
Figure 5C:
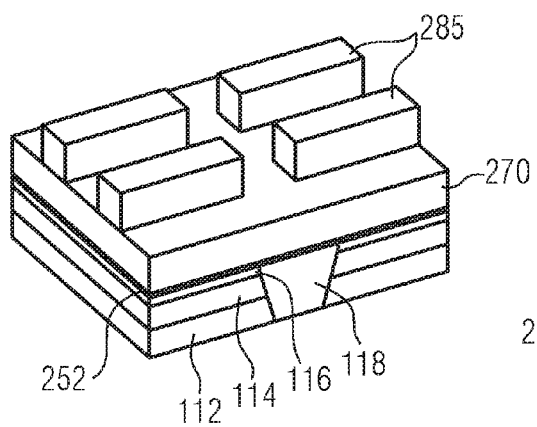

The starting point of the third manufacturing method is identical to the starting point for the other manufacturing methods with the hard mask 285 being patterned to form gate lines, as shown in FIG. 5A. Differently from the second manufacturing method, the cut mask with the planarization layer 289, the hard mask layer 288, and the photoresist mask 286 is, however, deposited on the one-dimensionally patterned hard mask 285, as shown in FIG. 5B, before the recess is formed in the gate electrode layer 270 using PC-HMO. Again, openings 287 are formed in the cut mask to complete the two-dimensional patterning of the hard mask 285, as shown in FIG. 5C.

Figure 5D:
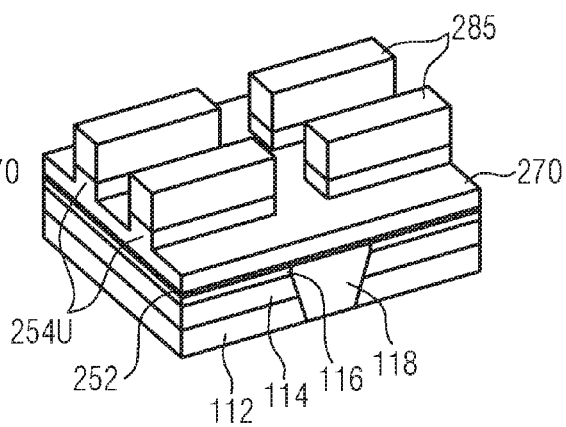

The partial etch step may then be performed as part of the standard HKMG FET structuring procedure by controlling the silicon etch step to be carried out only partially, i.e., by removing only part of the initial thickness of the gate electrode layer 270, as shown in FIG. 5D. Consequently, partial etching into the gate electrode layer is performed in both planar dimensions at the same time according to this example to define multiple gate structures. Underneath the patterned hard mask 285, the upper portion 254U of the gate electrodes is left standing.

Figure 5E:
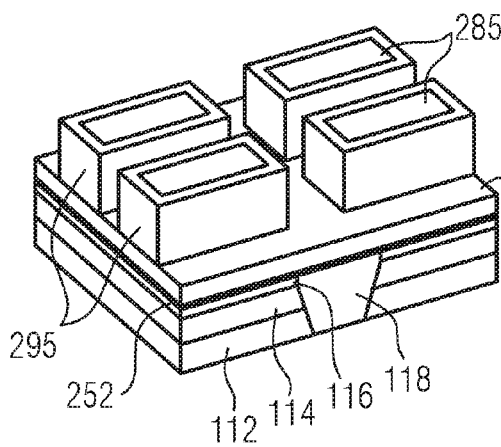

With the gate electrode layer 270 partially removed, the manufacturing process proceeds as in the second example by blanket deposition of the conformal protective layer over the patterned hard mask 285, the upper portion 254U of the gate electrodes and the remaining gate electrode layer 270 and performing an anisotropic etch to break through the horizontal parts of the protective layer. The resulting remnants 295 of the protective layer encase the sides of the upper portion 254U and the hard mask 285 as described above in the context of FIG. 4E and as shown in FIG. 5E. Due to the padding of the upper portion 254U of the gate electrodes along the gate lines, the above-described reduction of the tip-to-tip distance is also possible according to the third exemplary method.

Figure 5F:
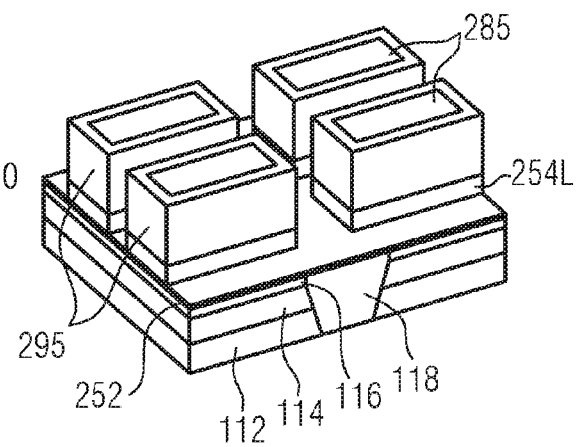
Figure 5G:
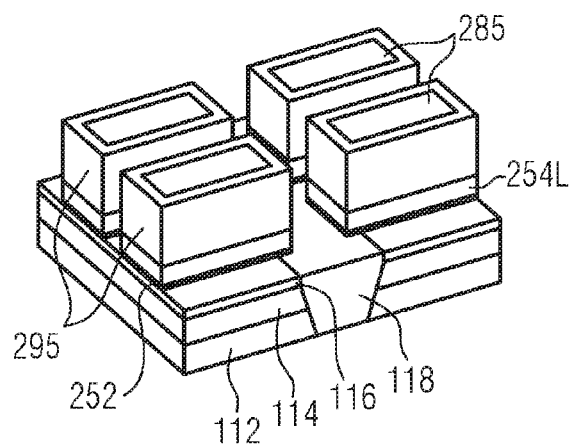

Finally, the remainder of the gate electrode layer 270 is removed using the encased hard mask and upper portion as a mask to form the extended lower portion 254L of the gate electrodes, as shown in FIG. 5F. With the removal of the HKMG layer 252 by completion of the HKMG FET manufacturing process, the gate structure is completed, as shown in FIG. 5G. While not easily distinguishable from the gate structures of the second example, the third manufacturing method provides a more uniform thickness of the partially etched gate electrode layer due to performing the partial etch in both planar dimensions at the same time. Consequently, control of the partial etching process is simpler than in the first two examples.

FIG. 6 shows the final structure of an HKMG transistor with RSD regions according to the present disclosure. With respect to the substrate 110 and its components, the semiconductor bulk substrate 112, the BOX layer 114 and the semiconductor layer 116, as well as the raised source region 125 formed on the source region 120 in the semiconductor layer 116, the raised drain region 135 formed on the drain region 130 in the semiconductor layer 116, and the channel region 140 in the semiconductor layer 116, the HKMG transistor 600 according to the present disclosure conforms to the HKMG transistor 100 of the art as described with respect to FIG. 1. A repeated description is, therefore, omitted for the sake of clarity.

Differently from the HKMG transistor 100 of the art, the HKMG transistor 600 of the present disclosure has a gate 650 with a cascaded profile. In other words, and as described repeatedly above, the gate electrode comprises an upper portion 654U and a lower portion 654L over the HKMG layer 652, wherein the lower portion 654L has a larger lateral extent than the upper portion 654U. The lateral extent may be 4-10 nm larger. This is achieved by padding the sides of the upper portion 654U with the remnants 660 of a conformal protective layer as described above. Finally, sidewall spacers 656 are provided on the side of the protective layer 660, the lower portion 654L and the HKMG layer 652 to electrically insulate the gate 650 from the raised source and drain regions 125 and 135.

Consequently, the HKMG transistor 600 according to the present disclosure has an HKMG gate stack with a gate dielectric layer and a gate electrode layer over a substrate as well as raised source and drain regions, wherein the gate electrode layer has an upper portion 654U and a lower portion 654L, wherein the extent of the upper portion 654U between the raised source and drain regions 125 and 135 is smaller than the extent of the lower portion 654L between the raised source and drain regions 125 and 135, and wherein only the upper portion 654U is provided with a liner 660 on the sides toward the raised source and drain regions.

A gate structure wherein the liner 660 is only provided on the sides toward the raised source and drain regions 125 and 135 may be formed using the manufacturing method according to the first example, while a gate structure with the liner 660 provided on all sides, i.e., also along the gate lines, may be formed using the manufacturing methods according to the second and third examples.

As described above, a nitride layer, such as SiN, or a low-k dielectric layer may be used for the conformal liner 660. The liner may further have a lateral thickness between 2-10 nm. The gate structure may be formed such that both the extent of the upper portion 654U and the lower portion 654L between the raised source and drain regions is substantially constant across the thickness of the upper and the lower portion, respectively. Substantially constant in this context is intended to signify a constant extent within manufacturing tolerances. It, therefore, differs from the tapered shape of the raised source and drain regions 125 and 135, e.g., due to the selective epitaxial growth. The resulting profile of the gate electrode is thus a step-like profile which allows for a maximum reduction of the parasitic capacitance. The relative thicknesses of the upper and lower portions above the substrate 110 may be chosen to allow for a strong reduction of the parasitic capacitance while maintaining a good overlap with the source and drain regions 120 and 130 in the semiconductor layer 116. A good working example may be chosen with the thickness of the upper portion 654U being substantially equal, i.e., equal within manufacturing tolerances, to the thickness of the lower portion 654L.

It shall be understood that the above-described specifications and variations of the materials, properties and shapes of the individual elements of the disclosed manufacturing methods and the HKMG transistor 100 according to the art may also be applied, wherever applicable, to the HKMG transistor 600 according to the present disclosure. By way of example, a fully-depleted silicon-on-insulator substrate may be used for the substrate 110.

In conclusion, a manufacturing method and corresponding transistor device are provided which allow for a significant boost of AC performance due to a substantial reduction of the parasitic capacitance without adversely affecting the DC performance of the device. The manufacturing method may be implemented in various alternatives by adding modifications to an existing high-k metal gate FET manufacturing method. The additional method steps are self-aligned and may be implemented in a cost-efficient way and with a high yield. As an additional advantage, further reduction of the tip-to-tip distance of the resulting gate structures is possible due to a reduction of the bottom critical distance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
forming a multilayer stack for a gate on a substrate, said multilayer stack including a gate electrode layer of amorphous silicon or polycrystalline silicon;
patterning a hard mask layer formed above said gate electrode layer to define a patterned hard mask, said patterned hard mask having a plurality of elements;
etching partially into said gate electrode layer through said patterned hard mask to define multiple partially etched gate stacks and a partially etched gate electrode layer;
etching said multiple partially etched gate stacks to remove first portions of said partially etched gate electrode layer to define pairs of axially aligned gate stack segments from each of said multiple partially etched gate stacks;
forming a conformal protective layer over at least lateral surfaces of said partially etched gate electrode layer and said patterned hard mask; and
etching through a remainder of said partially etched gate electrode layer in the presence of said conformal protective layer to define a plurality of pairs of axially aligned gate structures from said axially aligned gate stack segments.

2. The method of claim 1, wherein etching partially into said gate electrode layer comprises etching partially into said gate electrode layer after patterning said hard mask along a first planar dimension to define multiple gate lines extending above said substrate along said first planar dimension.

3. The method of claim 2, wherein etching said multiple partially etched gate stacks to define said pairs of axially aligned gate stack segments further comprises etching through said patterned hard mask and partially into said gate electrode layer across said gate lines along a second planar dimension, wherein said first and second planar dimensions are oriented orthogonal to one another.

4. The method of claim 3, wherein etching partially into said gate electrode layer is performed in both said first and second planar dimensions at the same time after patterning said hard mask layer in both said first and second planar dimensions to define multiple gate structures.

5. The method of claim 1, wherein said patterned hard mask is comprises one of a single SiN layer or an $SiO_2$ layer disposed on top of a SiN layer.

6. The method of claim 1, wherein etching partially into said gate electrode layer comprises etching partially into said gate electrode layer such that, after said partial etching process is completed, approximately between 20% and 80% of an initial thickness of said gate electrode layer is removed during said partial etching step.

7. The method of claim 1, wherein said conformal protective layer comprises a nitride layer or a low-k dielectric layer.

8. The method of claim 1, wherein forming said conformal protective layer wrapping over said partially etched gate electrode layer and said patterned hard mask comprises anisotropically etching said conformal protective layer so as to expose portions of said partially etched gate electrode layer and thereafter performing the step of etching through said remainder of said partially etched gate electrode layer.

9. The method of claim 8, wherein said multilayer stack further includes a bottom layer comprising a high-k dielectric material and a middle layer comprising a metal, and wherein the method further comprises etching through said middle layer and said bottom layer in regions outside said plurality of pairs of axially aligned gate structures.

10. The method of claim 9, further comprising:
depositing a spacer layer over said plurality of pairs of axially aligned gate structures; and
anisotropically etching said spacer layer to provide sidewall spacers for said plurality of pairs of axially aligned gate structures.

11. The method of claim 10, further comprising:
forming raised source and drain (RSD) regions adjacent to said sidewall spacers; and
removing said patterned hard mask to expose a top surface of said gate electrode layer.

12. The method of claim 1, wherein said substrate is a fully-depleted silicon-on-insulator substrate.

13. The method of claim 1, wherein etching said multiple partially etched gate stacks to remove said first portions comprises:
forming a cut mask above said multiple partially etched gate stacks, said cut mask having an opening exposing second portions of said patterned hard mask above said first portions of said partially etched gate electrode layer; and
removing said second portions of said patterned hard mask through said cut opening.

14. The method of claim 13, wherein said conformal protection layer is formed prior to etching said multiple partially etched gate stacks to remove said first portions.

15. The method of claim 14, further comprising removing portions of said conformal protection layer adjacent said first portions of said partially etched gate electrode layer and portions of said conformal protection layer adjacent said second portions of said patterned hard mask through said opening.

16. The method of claim 13, further comprising removing said first portions of said partially etched gate electrode layer through said opening.

17. The method of claim 13, further comprising forming said conformal protection layer after etching said multiple partially etched gate stacks to remove said first portions, wherein said conformal protection layer covers sidewall and end portions of said axially aligned gate stack segments.

18. The method of claim 17, further comprising removing said cut mask, wherein said etching partially into said gate electrode layer and said etching of said multiple partially etched gate stacks to remove said first portions are performed concurrently after removing said cut mask.

19. The method of claim 17, wherein a spacing between upper portions of said gate structures in each pair of axially aligned gate structures is less than a spacing between lower portions of said gate structures in each pair of axially aligned gate structures.

20. A method, comprising:
forming a multilayer stack for a gate on a substrate, said multilayer stack including a gate electrode layer of amorphous silicon or polycrystalline silicon;

patterning a hard mask layer formed above said gate electrode layer to define a patterned hard mask, said patterned hard mask having a plurality of elements;

forming a cut mask above said patterned hard mask layer, said cut mask having an opening exposing first portions of said patterned hard mask;

etching said patterned hard mask through said opening to define a plurality of pairs of axially aligned hard mask segments above said first portions of said partially etched gate electrode layer;

etching partially into said gate electrode layer through said patterned hard mask to define multiple partially etched gate stacks and a partially etched gate electrode layer, each of said multiple partially etched gate stacks including a pair of axially aligned gate stack segments;

forming a conformal protective layer over at least lateral surfaces of said partially etched gate electrode layer and said patterned hard mask; and etching through a remainder of said partially etched gate electrode layer in the presence of said conformal protective layer to define a plurality of pairs of axially aligned gate structures from said axially aligned gate stack segments.

* * * * *

UNITED STATES PATENT AND TRADEMARK OFFICE
CERTIFICATE OF CORRECTION

PATENT NO.        : 9,923,076 B2
APPLICATION NO.   : 15/185593
DATED             : March 20, 2018
INVENTOR(S)       : Elliot John Smith Page 1 of 1

It is certified that error appears in the above-identified patent and that said Letters Patent is hereby corrected as shown below:

Column 15, Line 14 (Claim 5, Line 2), after "mask" delete "is".

Signed and Sealed this
Third Day of July, 2018

Andrei Iancu
*Director of the United States Patent and Trademark Office*